(12) United States Patent
Assaad et al.

(10) Patent No.: US 12,323,057 B2
(45) Date of Patent: Jun. 3, 2025

(54) SYSTEM AND METHOD FOR ADAPTIVE GATE DRIVE CURRENT CIRCUIT

(71) Applicant: TEXAS INSTRUMENTS INCORPORATED, Dallas, TX (US)

(72) Inventors: Rida Shawky Assaad, Murphy, TX (US); Angelo William Pereira, Allen, TX (US); Gangqiang Zhang, Plano, TX (US); Kae Ann Wong, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 289 days.

(21) Appl. No.: 17/697,008

(22) Filed: Mar. 17, 2022

(65) Prior Publication Data
US 2022/0302840 A1    Sep. 22, 2022

Related U.S. Application Data

(60) Provisional application No. 63/162,806, filed on Mar. 18, 2021.

(51) Int. Cl.
*H02M 1/08* (2006.01)
*H02M 3/158* (2006.01)

(52) U.S. Cl.
CPC .............. *H02M 3/158* (2013.01); *H02M 1/08* (2013.01)

(58) Field of Classification Search
CPC ...... H02M 1/08; H02M 1/0029; H02M 3/158; H03K 17/166; H03K 17/167; H03K 17/168
See application file for complete search history.

(56) References Cited

U.S. PATENT DOCUMENTS 9,866,099 B1   1/2018  Assaad et al.
10,461,732 B1 * 10/2019  Norling ................ H03K 17/168
(Continued)

FOREIGN PATENT DOCUMENTS

CN   114050712 A  *  2/2022  ........... H03K 17/165
EP     3767810 A1     1/2021

OTHER PUBLICATIONS

Y. Lobsiger and J. W. Kolar, "Closed-loop IGBT gate drive featuring highly dynamic di/dt and dv/dt control, " 2012 IEEE Energy Conversion Congress and Exposition (ECCE), Raleigh, NC, USA, 2012, pp. 4754-4761 (Year: 2012).*

(Continued)

*Primary Examiner* — Gustavo A Rosario-Benitez
*Assistant Examiner* — Jye-June Lee
(74) *Attorney, Agent, or Firm* — Valerie M. Davis; Frank D. Cimino

(57) ABSTRACT

In a switching regulator driver, a sense circuit has a transistor current input and a sense circuit output. A logic circuit has a logic circuit input and first and second outputs. The logic circuit input is coupled to the sense circuit output. A counter has a counter clock input, a counter control input and a counter output. The counter clock input is coupled to the first output. The counter control input is coupled to the second output. The counter is configured to provide a count value at the counter output. A programmable drive strength circuit has a drive strength circuit input and a transistor control output. The drive strength circuit input is coupled to the counter output. The programmable drive strength circuit is configured to adjust a drive current at the transistor control output based on the count value.

20 Claims, 4 Drawing Sheets

(56) References Cited

U.S. PATENT DOCUMENTS

| | | |
|---|---|---|
| 2004/0095264 A1 | 5/2004 | Thomas |
| 2011/0234185 A1 | 9/2011 | Nagase et al. |
| 2014/0015571 A1* | 1/2014 | Wagoner .............. H03K 17/168 |
| | | 327/109 |
| 2017/0373676 A1* | 12/2017 | Kaeriyama .......... H03K 17/167 |
| 2018/0269869 A1* | 9/2018 | Mukhopadhyay ...... H02M 1/08 |
| 2020/0076292 A1* | 3/2020 | Tomisawa ............... H02M 1/08 |
| 2020/0395930 A1 | 12/2020 | Araki |

OTHER PUBLICATIONS

International Search Report for PCT/US2022/020856 mailed Jun. 15, 2022.

\* cited by examiner

SYSTEM AND METHOD FOR ADAPTIVE GATE DRIVE CURRENT CIRCUIT

CROSS-REFERENCE TO RELATED APPLICATION

This application claims priority to U.S. Provisional Patent Application No. 63/162,806 filed Mar. 18, 2021, which is hereby incorporated by reference.

BACKGROUND

A switching regulator is an electronic circuit that converts an input direct current (DC) voltage into a DC output voltage that is higher or lower in magnitude than the input DC voltage. Various types of switching regulators are available. Examples include buck converters, boost converters, buck-boost converters, etc.

A buck converter, for example, includes a high side transistor (operated as a switch) coupled to a low side transistor (also operated as a switch) at a switch node. A controller asserts control signals to cause the high and low side transistors to reciprocally open and close thereby alternately opening (a) a current path from the input voltage through the high side transistor and through the switch node to an inductor and capacitor and (b) a current path from ground through the low side transistor and through the switch node to the inductor and capacitor. By reciprocally opening and closing the high and low side transistors, a square wave voltage (toggling between approximately the input voltage and ground) is created on the switch node. The square wave has a duty cycle which is a function of the applied input voltage and the target output voltage and is implemented by the controller for the high low side transistor. The square wave then is filtered by the inductor and capacitor to generate the DC output voltage, which may be used to power an electrical load.

SUMMARY

In a switching regulator driver, a sense circuit has a transistor current input and a sense circuit output. A logic circuit has a logic circuit input and first and second outputs. The logic circuit input is coupled to the sense circuit output. A counter has a counter clock input, a counter control input and a counter output. The counter clock input is coupled to the first output. The counter control input is coupled to the second output. The counter is configured to provide a count value at the counter output. A programmable drive strength circuit has a drive strength circuit input and a transistor control output. The drive strength circuit input is coupled to the counter output. The programmable drive strength circuit is configured to adjust a drive current at the transistor control output based on the count value.

DETAILED DESCRIPTION

Figure 1:
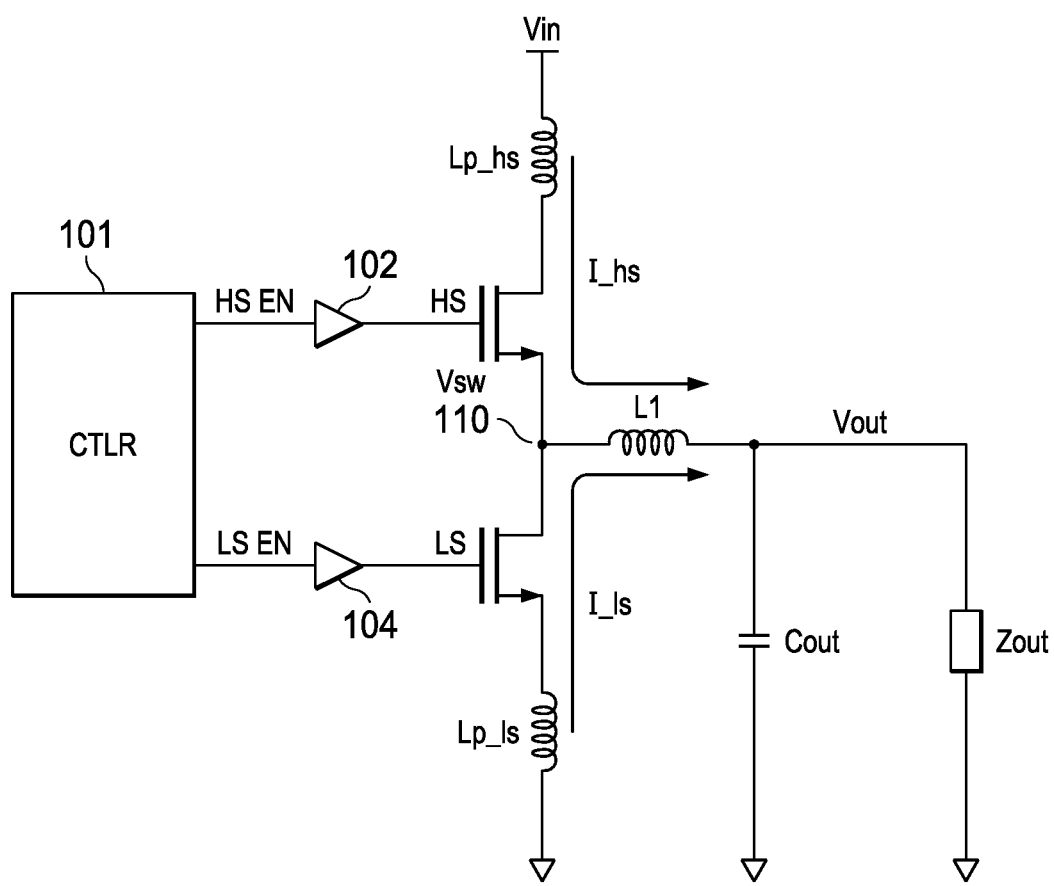
FIG. 1 illustrates a portion of a buck converter in accordance with an example.

As described above, switching regulators translate an input voltage to an output voltage at a different magnitude (higher or lower) than the input voltage. In a switching regulator, one or more transistors are opened and closed to cause a waveform with a particular duty cycle to be created on a switch node. FIG. 1 illustrates a portion of a buck converter in which a high side (HS) transistor is coupled to a low side (LS) transistor at a switch node 110. The HS and LS switches in this example are both n-channel field effect transistors (NFETs), but can be implemented as other types of transistors in other examples. The drain of the HS transistor is coupled to the input voltage (Vin), and the source of the LS transistor is coupled to ground. The voltage on the switch node 110 is designated Vsw. An inductor L1 is coupled to the switch and to a capacitor Cout. The connection between the inductor L1 and the capacitor Cout is the output (Vout) of the regulator. A driver 102 has an input that receives a digital input signal, HS_EN, from a controller 101. The driver 102 has an output which is coupled to the gate of the HS transistor. When HS_EN is asserted (e.g., logic high) by the controller 101, the driver 102 responds by producing a voltage on its output to turn on the HS transistor, and current I_hs flows from Vin, through the HS transistor, and through the switch node 110 to the inductor L1. Similarly, a driver 104 has an input which receives a digital input signal, LS_EN, from the controller, and also has an output which is coupled to the gate of the LS transistor. When LS_EN is asserted (e.g., logic high), the driver 104 responds by producing a voltage on its output to turn on the LS transistor. When the LS transistor is on, current I_ls flows from ground, through the LS transistor, and through the switch node 110 to the inductor L1.

FIG. 1 also shows a parasitic inductance Lp_hs between the input voltage Vin and the drain of the HS transistor. Another parasitic inductance Lp-ls also exists between the source of the LS transistor and ground. These parasitic inductances result from, for example, connections to, and traces within, the circuit board on which the switching regulator is mounted.

To avoid a shoot-through current, the controller 101 does not command the drivers 102 and 104 to turn on both the HS and LS transistors at the same time. Instead, the controller 101 implements a "dead time" between switching the on/off state of the HS and LS transistors. For example, if the HS transistor is on (and the LS transistor off), the controller 101 first deasserts HS_EN (e.g., logic low) to turn off the HS transistor. After a short period of time (the dead time) to ensure that the HS transistor is off, the controller then asserts LS_EN to cause driver 104 to turn on the LS transistor. A dead time is also imposed after turning off the LS transistor and before turning on the HS transistor.

Figure 2:
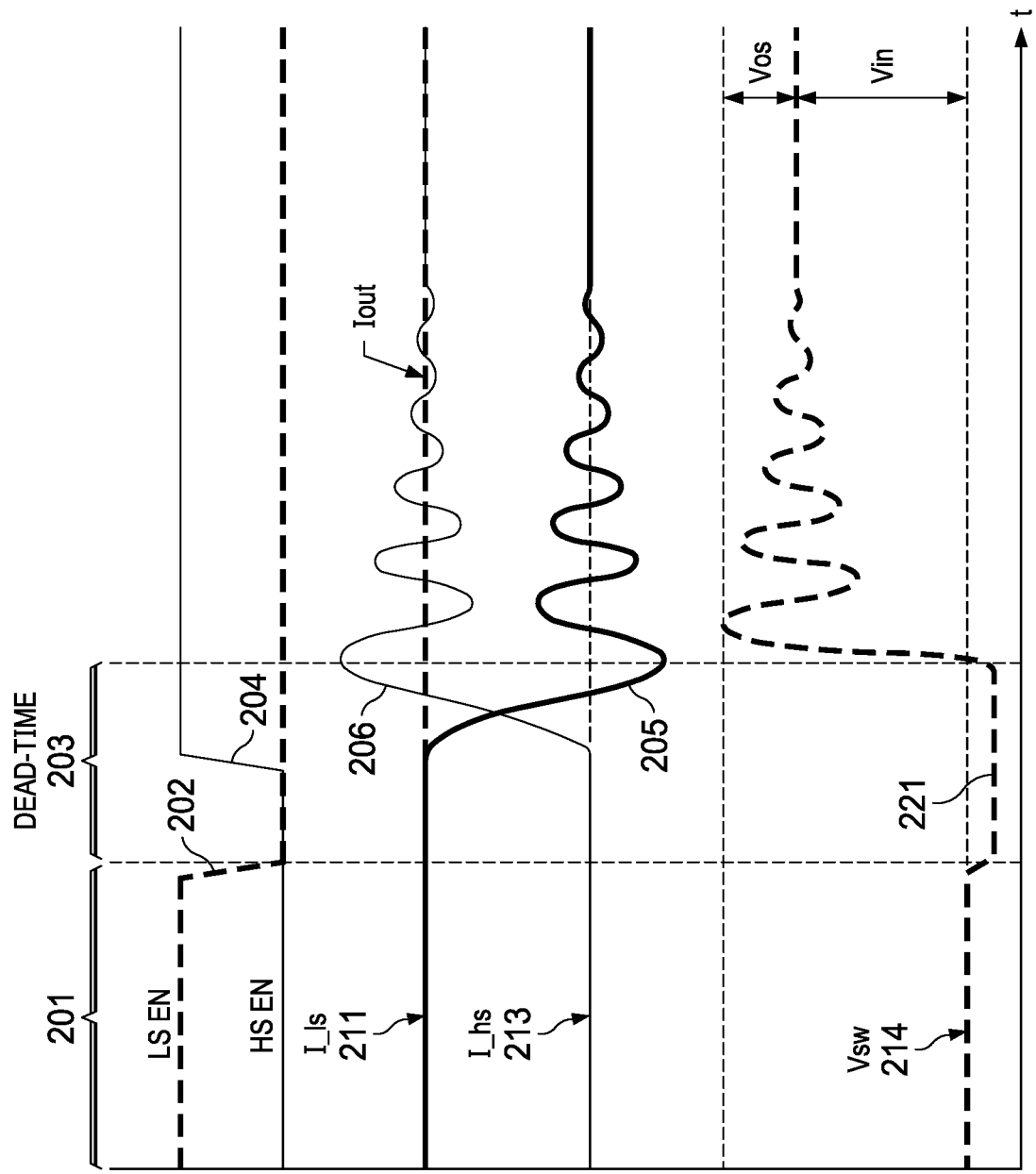
FIG. 2 is a timing diagram illustrating switch node voltage ringing of the buck converter in accordance with an example.

A switching regulator switches the on/off state of the HS and LS transistors at a application-specific frequency. In one example, the switching frequency is in the range of 100 KHz to 1 MHz. During each switching cycle, both the HS and LS transistors are turned on (albeit not concurrently). FIG. 2 is a timing diagram illustrating of a portion of one such switching cycle. At 201, the LS transistor is on and the HS transistor is off. The LS_EN signal is deasserted (falling edge 202) and dead time 203 ensues in which neither transistor is on. The controller 101 asserts HS_EN high (rising edge 204).

Waveform 211 is the current (I_ls) through the LS transistor. Waveform 213 is the current (I_hs) through the HS transistor. It takes a finite amount of time for the LS transistor to fully turn off and stop conducting current following the following edge 202 of LS_EN, and for the HS to fully turn on following the rising edge 204 of HS_EN. Current I_ls drops rapidly as shown at 205 and current I_hs increases rapidly as shown at 206. Waveforms 211 and 214 illustrate that ringing may occur on the currents I_hs and I_ls as the respective transistors transition state (the HS transistor turning on and the LS transistor turning off). The ringing occurs because a resonant circuit is formed including Lp_hs, the channel resistance of the HS transistor and the parasitic capacitance of the switch node 110. Waveform 214 shows the switch node voltage Vsw. Vsw is initially low when the LS transistor is on, then dips slightly negative during dead-time 203 as shown at 221 due to the LS transistor's body-diode being forcibly forward-biased to maintain the continuous flow of the inductor current, and then rises and also rings as the HS transistor is turned on.

The ringing on the switch node 110 can create conductive and radiative high-frequency electromagnetic interference (EMI), which unfortunately may be received by other components in the system that shares, for example, the same voltage domain of Vin. For example, in an automobile in which Vin is the battery's voltage, other circuits in the automobile may receive the EMI signals from the voltage regulator. The technique described herein to reduce ringing in a switching regulator is to reduce the drive current to the gate of the HS transistor during the portion of the process for turning on the HS transistor during which a higher level of ringing would otherwise occur.

In accordance with various examples, an adaptive high side gate driver is described herein that segments the drive current into the gate of the HS transistor into three phases. In the first phase, a relatively large magnitude, but short duration, drive current is provided into the gate of the HS transistor. This high current pulse causes the gate-to-source voltage (Vgs) to quickly reach the threshold voltage of the transistor. As the Vgs of the HS transistor increases towards the threshold voltage, the HS transistor is still off and unable to conduct any drain current and thus switch node ringing is unable to occur during this time period. In the ensuing second phase, the drive current is reduced to a lower level to dampen switch node ringing. Upon the switch node voltage beginning to rise, the adaptive high side gate driver increases the magnitude of the drive current into the gate of the HS transistor to complete the turn-on process of the transistor. The magnitude of the drive current during the second phase is programmable as described herein to cause the drive current to be as large as possible to quickly turn on the transistor but without also causing excessive ringing on the switch node.

The embodiments described herein pertain to an adaptive driver for the HS transistor. A similar adaptive driver for the LS transistor may not be included because the body-diode of the LS transistor conducts before the LS transistor is turned "on", and by then the effect on the Lp_ls parasitic inductance due to the rate of change of current through the LS transistor has already subsided.

Figure 3:
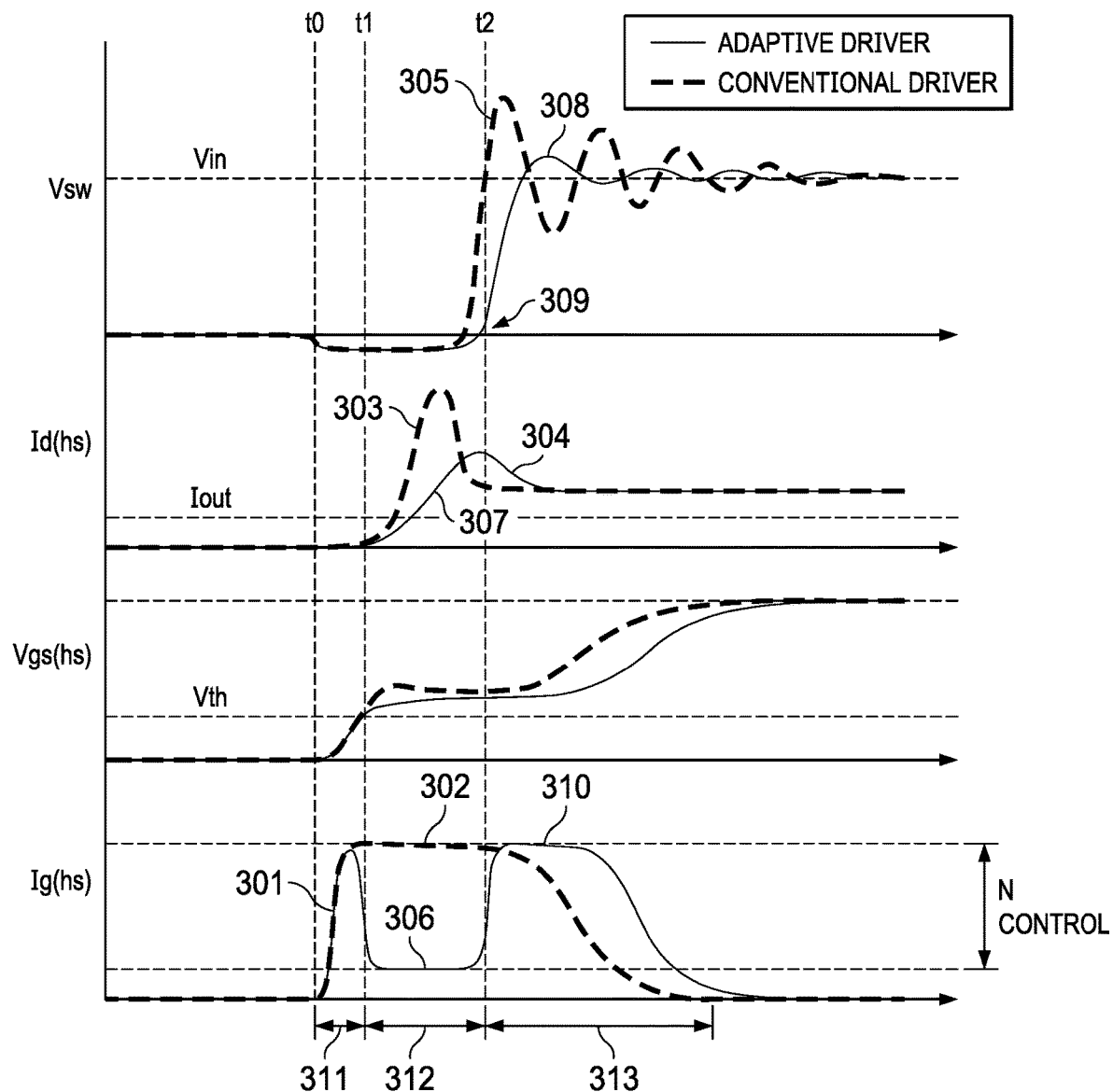
FIG. 3 is a timing diagram illustrating operation of a driver for reducing the switch node voltage ringing in accordance with an example.

FIG. 3 is a timing diagram illustrating a comparison between a switching regulator that includes the adaptive high side gate driver described herein and a switching regulator that includes a conventional high side gate driver. A conventional high side gate driver causes a large drive current to flow into the gate of the HS transistor to turn on the transistor. The dashed waveforms are for the conventional high side gate driver, and the solid curves are for the adaptive high side gate driver. At time t0, the controller asserts the HS_EN signal (not shown in FIG. 3) to cause the gate driver to begin to turn on the HS transistor.

For the conventional high side gate driver, the driver rapidly increases (as indicated at 301) the drive current to the HS transistor's gate and maintains that high level of drive current (as indicated at 302) until the HS transistor is fully on. As the channel of the HS transistor begins to conduct, the drain current (Id(hs)) increases very rapidly as shown at 303 before settling at a steady state current (304). A high degree of ringing results on the switch node as indicated at 305.

For the adaptive high side gate driver described herein, the drive current into the gate is also high during the initial phase 311 to cause the Vgs of the transistor to reach the threshold voltage. However, rather than maintaining the drive current at the high level (as was the case for the conventional high side gate driver), the adaptive high side gate driver decreases the drive current as indicated at 306. In one embodiment, the initial phase 311 occurs for a fixed period of time (e.g., 2 ns). The gate current during the second phase 312 is adaptively configured as described herein to be high to complete the turn-on process for the HS transistor but while reducing the rate of change of the drain current as indicated at 307 (compared to the higher rate of change at 303 for the conventional high side gate driver). By forcing the drain current to increase at a lower rate, much less ringing results on the switch node as indicated at 308. The third phase 313 begins responsive to the adaptive high side gate driver detecting that the switch node voltage Vsw begins to rise (as indicated at 309). When Vsw is determined to be rising, then the drive current to the HS transistor can again be increased (310) without further exacerbating any switch node ringing.

Referring again to FIG. 1, a rapid increase in the drain current I_hs through the HS transistor will result in a voltage drop across the parasitic inductance Lp_hs. The magnitude of the voltage drop across the parasitic inductance Lp_hs is the product of the rate change of I_hs and the inductance of Lp_hs. Accordingly, as the rate of change of I_hs increases, the voltage drop across the parasitic inductance Lp_hs increases. The upper terminal of Lp_hs is coupled to Vin, which is a fixed voltage. Thus, a voltage drop across the parasitic inductance Lp_hs will necessitate a drop in the voltage on the lower terminal of the inductance. The lower terminal of the parasitic inductance Lp_hs is the voltage on the drain of the HS transistor. As described below, by monitoring the voltage on the drain of the HS transistor, a determination can be made as to how rapidly I_hs is increasing as the HS transistor is turned on. The adaptive high side gate driver compares the voltage on drain of the HS transistor to a threshold. If the HS transistor's drain voltage exceeds the threshold. which indicates that excessive ringing is likely to occur on I_hs and the switch node 110, then in the next switching cycle, the adaptive high side gate driver decreases the drive current to the gate of the HS transistor during the second phase 312 (FIG. 3). The adaptive high side gate driver continues to decrease the drive current to the gate of the HS transistor in each subsequent switching cycle until the voltage on the drain of the HS transistor no longer exceeds the threshold.

Figure 4:
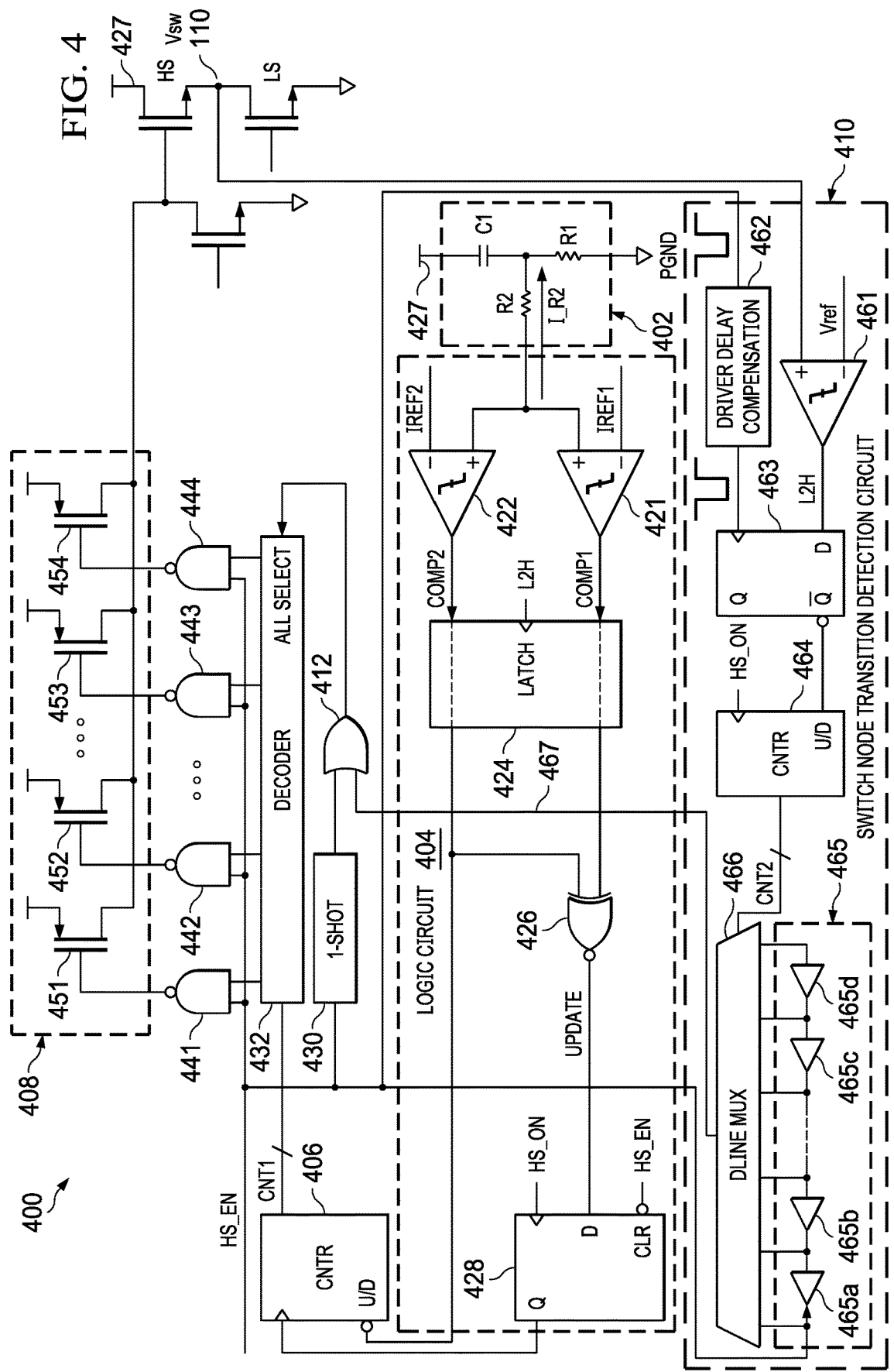
FIG. 4 is a schematic illustrating the transistor driver for reducing switch node voltage ringing in accordance with an example.

FIG. 4 is a schematic showing an embodiment of an adaptive high side gate driver which can be used to implement the gate driver 102 of FIG. 1. The right-hand side of the schematic shows the HS transistor coupled to the LS transistor at the switch node 110. The adaptive high side gate driver 400 includes a sense circuit 402, a logic circuit 404, a counter 406, a programmable drive strength circuit 408, a switch node transition detection circuit 410, OR gate 412, NAND gates 441-444, a one-shot 430, and a decoder 432. The description of the driver 400 is described below in terms of the three phases of the turn-on process for the HS transistor.

As described above, the initial phase is a fixed (but short) time period during which a relatively high level of drive current is provided to the gate of the HS transistor. The HS_EN signal is coupled to an input of the one-shot 430. The one-shot 430 has an output which is coupled to an input of OR gate 412. The output of the OR gate 412 (and the signal 415 on the OR gate's output) is coupled to an "all select" input of the decoder 432. The decoder 432 has multiple outputs, each of which is coupled to an input of a respective NAND gate 441-444. The other inputs of NAND gates 441-444 receive the HS_EN signal. The programmable drive strength circuit 408 includes multiple PFETs 451-454. The outputs of NAND gates 441-444 are coupled to the gates of the respective PFETs 451-454. An output signal from a NAND gate 441-444 will be logic low responsive to both inputs of the gate being logic high. Accordingly, with HS_EN being logic high (to cause the adaptive high side gate driver 400 to begin to turn on the HS transistor), an output of a NAND gate 441-444 will become logic low responsive to the respective decoder's output being asserted high, thereby turning on that particular PFET 451-454. With a given PFET 451-454 being on, drive current flows through the PFET to the gate of the HS transistor. The decoder 432 thus causes one or more of the PFETs 451-454 to turn on thereby controlling the amount of drive current into the HS transistor's gate.

Responsive to a rising edge on HS_EN (which initiates the turn-on process for the HS transistor), the one-shot 430 produces an output pulse (logic high) for a time duration implemented by the one-shot. In one example, the width of the one-shot's output pulse is 2 ns, but can be other than 2 ns as desired. The width of the one-shot's output pulse is an amount of time that approximates how long it will take to cause the Vgs of the HS transistor to increase from 0 V to its threshold voltage. The short duration positive output pulse from the one-shot 430 results in a similar output pulse for signal 415 on the output of the OR gate 412 (the other input of the OR gate 412 is logic low at this point in the cycle). The short duration pulse on signal 415 is received by the decoder 432 on its "all select" input, which in response, causes all of the decoder's output signals to the NAND gates 441-444 to be asserted high. At this point, both inputs of all of the NAND gates 441-444 are logic high, which causes the output signals from the NAND gates 441-444 to the gates of all of the PFETs 451-454 within the programmable driver strength circuit 408 to be logic low, thereby turning on all of the PFETs 451-454 to provide a large drive current (the largest current the programmable drive strength circuit 408 can produce) to the gate of the HS transistor.

The high level of drive current supplied by the programmable driver strength circuit 408 to the gate of the HS transistor during this initial phase causes the Vgs of the HS transistor to rapidly rise towards the threshold voltage of the HS transistor. The one-shot's output pulse then transitions low again, which causes the output signal 415 from the OR gate 414 to become logic low. Signal 415 becoming logic low coincides with the end of the first phase 311 and the beginning of the second phase 312.

The second phase 312 starts with the decoder 432 switching from causing all of the PFETs 451-454 being on to only turning on a subset of the PFETs in accordance with a count value CNT1 from the counter 406. By turning on some, but not all, of the PFETs 451-454, the magnitude of the drive current to the gate of the HS transistor decreases (as indicated at 306 in FIG. 3). During the second phase 312, the Vgs of the HS transistor has reached the threshold voltage and drain current begins to flow through the HS transistor. The sense circuit 402 includes a capacitor C1 and resistors R1 and R2. C1 is coupled between VIN and thus the drain 427 of the HS transistor and R1. Node A is the connection point between C1 and R1. The combination of C1 and R1 form a high-pass filter to high-pass filter the voltage on the drain of the HS transistor. As described above, a sudden in-rush of drain current into the drain of the HS transistor causes a voltage drop on the drain of the HS transistor (the magnitude of which is proportional to the rate of change of the current through the HS transistor) due to the parasitic inductance Lp_hs (FIG. 1).

The logic circuit 404 includes comparators 421 and 422, a dual latch 424, an exclusive-NOR gate 426, and a flip-flop 428. In this example, the comparators 421 and 422 are current comparators, but can be implemented as voltage comparators in other embodiments. In this example, the positive inputs (+) of comparators 421 and 422 are coupled together and to resistor R2. The voltage on the positive input comparators is approximately constant. The current through R2, I_R2, is thus a function of the voltage on node A, and the voltage on node A is the filtered output of the high-pass filter comprising C1 and R1. As the voltage on the drain of the HS decreases sharply, so does the voltage on node A. As a result of the drop in the voltage on node A, current I_R2 increases.

Comparator 421 compares current I_R2 to a reference current IREF1. Comparator 422 compares current I_R2 to a reference current IREF2. In one embodiment, IREF2 is a larger current than IREF1. COMP1 is the output signal from comparator 421, and COMP2 is the output signal from comparator 422. Responsive to I_R2 being larger than IREF2, the comparator 422 asserts COMP2 to a logic high state. Responsive to I_R2 being smaller than IREF2, comparator 422 forces COMP2 to a logic low state. Similarly, responsive to I_R2 being larger than IREF1, the comparator 421 asserts COMP1 to a logic high state. Responsive to I_R2 being smaller than IREF1, comparator 421 forces COMP1 to a logic low state. Accordingly, COMP1 and COMP2 indicate whether I_R2 is above both reference currents, below both reference currents, or between the reference currents.

I_R2 being larger than both reference currents indicates that the drain current through the HS transistor is increasing at a high enough rate that excessive ringing on the switch node 110 is likely, and thus the drive current to the gate of the HS transistor should be decreased. I_R2 being smaller than IREF2 but larger than IREF1 (i.e., I_R2 is in the range between the reference currents) indicates that the rate of change of the HS transistor's drain current (I_hs) is not so large as to create harmful switch node voltage ringing, and the drive current should not be changed. I_R2 being below both reference currents indicates that, while harmful switch node voltage ringing is unlikely, the magnitude of the drive current to the HS transistor's gate could be increased to accelerate the turn-on process for the HS transistor without also creating excessive switch node voltage ringing.

COMP1 and COMP2 are latched by the dual latch 424. The signal to the clock input of the dual latch 424 is L2H, which is the output signal from comparator 461 within the switch node transition detection circuit 410 (described below). Comparator 461 compares the switch node voltage Vsw to a reference voltage (approximately 0V) to detect when Vsw is rising. Signal L2H is the output signal from comparator 461 and is thus asserted high responsive to Vsw beginning to increase (point 309 in FIG. 3).

The latched COMP2 signal is coupled to an up/down control input of counter 406. A logic low for the latched COMP2 signal to the up/down control input causes the counter 406 to count up (i.e., increment its output count value, CNT1). Alternatively, a logic high for the latched COMP2 signal to the up/down control input causes the counter 406 to count down (decrement CNT1). The counter 406 is clocked responsive to a rising edge on the counter's clock input, and the clock signal to the counter is provided by the Q output of flip-flop 428. The data (D) input of flip-flop 428 is coupled to the output of exclusive-NOR gate 426. The latched COMP1 and COMP2 signals are coupled to the inputs of the exclusive-NOR gate 426. The output signal UPDATE from the exclusive-NOR gate 426 is a logic 0 when its inputs have opposite polarity (one input is a 0 and the other input is a 1). Otherwise (when both inputs are 0 or both inputs are 1), the UPDATE is a logic 1. UPDATE being a logic 1 indicates that either (a) I_R2 is too large meaning the drive current to the HS transistor should be reduced during the subsequent cycle's second phase of the turn-on process for the HS transistor, or (b) I_R2 is so small that the drive current to the HS transistor's gate should be increased. UPDATE being a logic 0 indicates that the drive current to the HS transistor's gate should not be changed.

Flip-flop 428 is clocked by a signal labeled HS_ON. HS_ON is asserted high responsive to the HS transistor fully turning on, for example, when its gate-to-source voltage has reached its maximum value thereby indicating the switch node voltage Vsw has reached and settled to a value near the input voltage Vin. HS_EN is connected to an active low CLR input, which, when asserted low, cause the Q output (provided to the clock input of counter 406) to be reset In some embodiments, flip-flop 428 is replaced with an AND gate having UPDATE and HS_ON on its inputs. When I_R2 is either larger than both reference currents IREF1 and IREF2 or when I_R2 is smaller than both reference currents, UPDATE is a logic 1 and is clocked through flip-flop 428 to clock the counter 406 to thereby increment or decrement the counter's output count value CNT1. In one example, counter 406 is a 3-bit counter and thus CNT1 is a 3-bit binary value. However, the counter 406 may be a 2-bit or more than 3-bit counter in other embodiments.

The direction of counting of counter 406 is controlled by the latched COMP2 signal on the up/down control input of the counter. COMP2 is high responsive to I_R2 being larger than IREF2. IREF2 is larger than IREF1, and thus COMP2 being logic high indicates that I_R2 is larger than both reference currents. Responsive to COMP2 being logic high, the counter 406 is configured to count down thereby decrementing CNT1 the next time the counter is clocked. Responsive to COMP2 being logic low, the counter 406 is configured to count up thereby incrementing CNT1 the next time the counter is clocked.

In the example of FIG. 4, the decoder 432 converts the binary CNT1 count value on its Select input to a thermometric code and provides the thermometric code to NAND gates 441-444. In one example, the programmable drive strength circuit 408 includes eight PFETs, and there is a NAND gate 441-444 for each of the eight PFETs. The 3-bit CNT1 value is converted by the decoder 432 in this example to an 8-bit thermometric code (minimum 1) to the eight NAND gates to thereby individually turn on or off the eight PFETs. For example, if CNT1 is decimal 6 (110 binary), then gate signals to seven (6 plus minimum 1) of the eight PFETs are pulled low (the remaining gate signal being logic high) to turn on seven PFETs. If CNT1 is decimal 2 (010 binary), then gate signals to three (2 plus minimum 1) of the eight PFETs are pulled low (the remaining five gate signals being logic high) to turn on only three of the eight PFETs.

When the HS transistor has fully turned on, COMP1 and COMP2 are latched through the dual latch 424 upon the high assertion of L2H from comparator 461. The latched COMP1 and COMP2 signals are then used to control the counter 406 to cause a change in CNT1 (if I_R2 is greater than both reference currents or smaller than both reference currents) to thereby increase the HS transistor's drive current (if I_R2 is smaller than both reference currents) or decrease the drive current (if I_R2 is larger than both the reference currents). If I_R2 is between the IREF1 and IREF2 reference currents, UPDATE from the exclusive-NOR gate is logic 0, the output of flip-flop 428 is a logic 0 and the counter 406 is not clocked, and if the counter 406 is not clocked, there will be no update to CNT1 and the drive current strength remains unchanged.

During the second phase 312 of the turn-on process for the HS transistor, the programmable drive strength circuit 408 is configured to adjust the magnitude of the drive current to the HS transistor's gate based on the count value CNT1 from the counter 406. The example of FIG. 4 includes a decoder 432 to convert the binary count value CNT1 to a thermometric code for turning on and off the PFETS 451-454. The PFETs are sized approximately equally and thus approximately the same amount of current flows through each PFET (when "on") to the gate of the HS transistor. In another embodiment, the PFETs 451-454 may be binary-weighted and thus drive current through one PFET is 1×, the drive current through another PFET is 2×, the drive current through another PFET is 4×, and so on. In an embodiment in which the PFETS 451-454 are binary-weighted, a decoder may be omitted and the binary count value CNT1 may be provided to the NAND gates 441-444.

The second phase 312 ends and the third phase 313 begins responsive to the switch node transition detection circuit 410 detecting a rise of the switch node voltage Vsw. The switch node transition detection circuit 410 generates an output signal 467 to an input of OR gate 412. When asserted high, output signal 467 causes (through OR gate 412 and NAND gate 414) signal 415 to again become logic high (signal 415 was logic high during the first phase 311 and then was low during the second phase 312). With signal 415 being logic high, the decoder 432 responds (as it did during the first phase 311) by causing all of the PFETs 451-454 within the programmable drive strength circuit 408 to be on thereby causing the larger drive current (310 in FIG. 3) to flow into the gate of the HS transistor.

The switch node transition detection circuit 410 includes the comparator 461, a driver delay compensation circuit 462, a flip-flop 463, a counter 464, a delay line 465, and a multiplexer 466. As described above, comparator 461 asserts the L2H signal to a logic high state thereby indicating that Vsw is increasing. The L2H signal from the comparator 461 is coupled to the D input of flip-flop 463. The driver delay compensation circuit 462 is a delay element (e.g., one or more serially-connected buffers, inverters, etc.) which drives the clock input of flip-flop 463. Flip-flop 463 determines the count direction (up or down) of counter 464. Counter 464 is clocked every switching cycle by HS_ON and its output CNT2 determines the length of delay line 465 through multiplexer 466. The output 467 of the multiplexer 466 is HS_EN delayed by delay line 465 and is coupled to an input of OR gate 412 (external to the switch node transition detection circuit 410) and the input of the driver delay compensation circuit 462. The output 467 of the multiplexer 466 is asserted logic high to initiate phase 313. Altogether, the elements of the switch node transition detection circuit 410 implement a time loop.

The purpose of the time loop created by the switch node transition detection circuit 410 is to align the engagement of all of the PFETs 451-454 within the programmable drive strength circuit 408 with the rising voltage of switch node 110, and a comparison is performed. However, simply comparing the output 467 of multiplexer 466 with the output of comparator 461 (L2H) generally does not suffice because output 467 causes, and thus always leads, L2H to be asserted. Therefore, a time correction is implemented by the driver delay compensation circuit 462. The amount of delay added to signal 467 by the driver delay compensation circuit 462 accounts for the total propagation delay of signal 467 through OR gate 412, decoder 432, NAND gates 441-444, programmable drive strength circuit 408 to the gate signal to the HS FET and the delay of comparator 461. The drive delay compensation circuit 462 may be implemented using a chain of serially-connected logic gates to match the delay of the above-described elements. Given the minimal variability of the above-described total propagation delay of signal 467, the driver delay compensation circuit 462 produces a corresponding rising edge on the clock input to the flip-flop 463 that occurs when the third phase 313 should begin.

The flip-flop 463 has an output Q and a Qbar output. In this example, the Qbar output of flip-flop 463 is used. When the output signal from the driver delay compensation circuit 462 clocks the flip-flop 463, the Qbar output from the flip-flop will either be a 0 or a 1. The Qbar output will be a 0 if, when flip-flop 463 clocks, the Vsw has started to rise (L2H is 1). Otherwise, the Qbar output will be a 1 if, when the flip-flop clocks, Vsw has not yet started to rise (L2H is 0). Accordingly, flip-flop 463 acts as a time comparator, and the logic state of the Qbar output indicates whether Vsw has or has not started to rise when the third phase 313 is anticipated to start.

The Qbar output of flip-flop 463 is coupled to an up/down control input of counter 464. Counter 464 is an up/down counter that increments its output count value, CNT2, responsive to the logic state of the up/down control input being a 1, and decrements CNT2 responsive to the logic state of the up/down control input being a 0.

The delay line 465 includes multiple serially-connected delay elements 465a-465d. Any number of delay elements may exist. In one example, each delay element 465a-465d implements a 250 picosecond (ps) delay. The input to the delay line 465 is HS_EN. The output signal from delay element 465a is HS_EN delayed by 250 ps. Delay element 465b adds an additional 250 ps delay and thus the output signal from delay element 465b is HS_EN delayed by 500 ps, and so on.

The connection points between adjacent delay elements within the delay line 465 are tapped and provided to inputs of the multiplexer 466. The counter's output count value CNT2 is the selection signal for the multiplexer 366. As CNT2 increments, the output signal from a subsequent delay (larger delay) element 465a-465d is selected as the multiplexer's output signal. As CNT2 decrements, the output signal from a previous delay (smaller delay) element 465a-465d is selected as the multiplexer's output signal.

The clock input to the counter 464 is HS_ON (described above). When the HS transistor is fully turned on, HS_ON is asserted high and clocks the counter 464 to increment or decrement CNT2. If Vsw has not started to rise (L2H is a 0) when the flip-flop 463 is clocked, the up/down control input of counter 464 will be a 1 which causes the counter 464 to count up. If Vsw has started to rise (L2H is a 1) when the flip-flop 463 is clocked, the up/down control input of counter 464 will be a 0 which causes the counter 464 to count down. The amount of the time delay between the rising edge of HS_EN and the rising edge of the multiplexer's output signal 467 is incrementally adjusted until that time delay is equal to the time duration of the second phase 312. When that happens, a positive assertion of signal 467 from multiplexer 466 will cause the decoder 432 to turn on all of the PFETs 451-454 in the programmable drive strength circuit during the third phase 313.

As the counter 464 counts up to increase the time delay, eventually the flip-flop will clock at a point in which Vsw has already started to rise which means the D input of the flip-flop will be a 1, the Qbar output will be a 0, and the counter's up/down control input will be a 0. With the up/down control input being a 0, the counter will be configured to count down at that point. The counter 464 may toggle between being configured as an up counter and a down counter with each subsequent switching cycle. The amount of time delay (e.g., 250 ps) of the delay elements 465a-465d, however, is small enough that repeatedly changing the starting point of the third phase 313 is not significant enough to substantially increase ringing on the switch node 110.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-channel field effect transistor ("PFET") may be replaced by an NFET with little or no changes to the circuit. Furthermore, other types of transistors may be used (such as bipolar junction transistors (BJTs)).

References herein to a field effect transistor (FET) being "on" means that the conduction channel of the FET is present and drain current is flowing through the FET. References herein to a FET being "off" means that the conduction channel is not present and drain current does not flow through the FET. An "off" FET, however, may have current flowing the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A device comprising:
   a sense circuit having a sense circuit output;
   a logic circuit having a logic circuit input, a first logic circuit output, and a second logic circuit output, the logic circuit input coupled to the sense circuit output, the logic circuit comprising an exclusive-NOR gate having a gate output coupled to the first logic circuit output;
   a counter having a first counter input, a second counter input, and a counter output, the first counter input coupled to the first logic circuit output, the second counter input coupled to the second logic circuit output, and the counter configured to provide a count value at the counter output; and
   a drive circuit having a drive circuit input coupled to the counter output, the drive circuit configured to produce a drive current based on the count value.

2. The device of claim 1, further comprising a decoder coupled between the counter output and the drive circuit input.

3. The device of claim 1, wherein the logic circuit is configured to: detect whether a rate of change of a drain current of a transistor is above a threshold; and responsive to the rate of change of the drain current being above the threshold, adjust the first logic circuit output or the second logic circuit output to change the count value.

4. The device of claim 1, wherein the logic circuit is configured to:
   detect whether a signal indicative of a rate of change of a drain current of a transistor is above first and second thresholds;
   responsive to the signal being above the first and second thresholds, adjust the first logic circuit output or the second logic circuit output to increment the count value; and
   responsive to the signal being below the first and second thresholds, adjust the first logic circuit output or the second logic circuit output to decrement the count value.

5. The device of claim 4, wherein the logic circuit is configured to: responsive to the signal being between the first and second thresholds, adjust the first logic circuit output or the second logic circuit output to prevent the counter from incrementing or decrementing the count value.

6. The device of claim 1, wherein the sense circuit includes a high-pass filter.

7. The device of claim 1, wherein the logic circuit further comprises:
   a first comparator having a comparator output and first and second comparator inputs, in which the comparator output is the second logic circuit output;
   a second comparator having a second comparator output and third and fourth comparator inputs; and
   a flip-flop having a flip-flop input and a flip-flop output, in which the flip-flop output is the first logic circuit output, and the flip-flop input is coupled to the gate output of the exclusive-NOR gate.

8. The device of claim 1, wherein:
   the logic circuit is configured to: detect whether a rate of change of a drain current of a transistor is above a threshold; and responsive to the rate of change of the drain current being above the threshold, adjust the first logic circuit output or the second logic circuit output to change the count value;
   the drive circuit is configured to decrease the drive current responsive to the adjusted count value;
   the device further comprises a switch node transition detection circuit configured to: detect whether the transistor has turned on; and responsive to detecting that the transistor has turned on, provide a signal to the logic circuit; and
   the drive circuit is configured to increase the drive current at a control terminal of the transistor responsive to the provided signal.

9. The device of claim 1, further comprising:
   a comparator having a comparator output;
   a delay circuit having a delay circuit output; and
   a flip-flop having a first flip-flop input, a second flip-flop input, and a flip-flop output, the first flip-flop input coupled to the delay circuit output, and the second flip-flop input coupled to the comparator output.

10. The device of claim 9, wherein the counter is a first counter, and the device further comprises a second counter having a third flip-flop input coupled to the flip-flop output.

11. A device comprising:
a sense circuit having a sense circuit output;
a first comparator having a first comparator output and a first comparator input, the first comparator input coupled to the sense circuit output;
a second comparator having a second comparator output and a second comparator input, the second comparator input coupled to the sense circuit output;
a logic gate having a logic gate output and first and second logic gate inputs, the first logic gate input coupled to the first comparator output, and the second logic gate input coupled to the second comparator output;
a first counter having a first counter input, a second counter input, and a first counter output, the first counter input coupled to the logic gate output, the second counter input coupled to the second comparator output;
a flip-flop having a flip-flop output;
a second counter having a third counter input and a second counter output, the third counter input coupled to the flip-flop output; and
a drive circuit having a drive circuit input, the drive circuit input coupled to the first counter output and the second counter output.

12. The device of claim 11, wherein the logic gate is an exclusive-NOR gate.

13. The device of claim 11, wherein the flip-flop is a first flip-flop, the device further comprising a second flip-flop having a flip-flop input, wherein the flip-flop input is coupled to the logic gate output.

14. The device of claim 11, wherein the sense circuit includes a high-pass filter.

15. The device of claim 11, further comprising:
a delay circuit having a delay circuit input and a delay circuit output, the delay circuit input coupled to the first counter output and the delay circuit output coupled to the drive circuit input.

16. A device comprising:
a sense circuit having a sense circuit output;
a logic circuit having a logic circuit input and first and second logic circuit outputs, the logic circuit input coupled to the sense circuit output;
a drive circuit having a drive circuit input and a drive circuit output; and
a counter having a first counter input, a second counter input, and a counter output, the first counter input coupled to the first logic circuit output, the second counter input coupled to the second logic circuit output, the counter output coupled to the drive circuit input, and the counter configured to provide a count value at the counter output; and wherein:
during a first phase, the drive circuit is configured to provide a fixed level of a drive current responsive to receiving a pulse for a time duration; and
responsive to the pulse ending, transitioning the device to a second phase, in which the drive circuit is configured to provide a variable level of the drive current at the drive circuit output responsive to the count value.

17. The device of claim 16, further comprising a decoder coupled between the counter output and the drive circuit input, in which the decoder is configured to convert the count value to a signal, and the drive circuit is configured to receive the signal at the drive circuit input.

18. The device of claim 16, wherein the logic circuit is configured to: detect whether a rate of change of a drain current at a transistor is above a threshold; and responsive to the rate of change of the drain current being above the threshold, adjust the first logic circuit output or the second logic circuit output to change the count value.

19. The device of claim 16, wherein the logic circuit is configured to:
detect whether a signal indicative of a rate of change of a drain current at a transistor is above first and second thresholds;
responsive to the signal being above the first and second thresholds, adjust the first logic circuit output or the second logic circuit output to increment the count value;
responsive to the signal being below the first and second thresholds, adjust the first logic circuit output or the second logic circuit output to decrement the count value; and
responsive to the signal being between the first threshold and the second threshold, maintain the count value.

20. The device of claim 16, further comprising:
a comparator having a comparator output;
a delay circuit having a delay circuit output; and
a flip-flop having a flip-flop clock input, a data input and a flip-flop output, the flip-flop clock input coupled to the delay circuit output, and the data input coupled to the comparator output.

* * * * *